(12) United States Patent
Otsubo et al.

(10) Patent No.: US 11,177,189 B2
(45) Date of Patent: Nov. 16, 2021

(54) MODULE INCLUDING HEAT DISSIPATION STRUCTURE

(71) Applicant: Murata Manufacturing Co., Ltd., Kyoto (JP)

(72) Inventors: Yoshihito Otsubo, Kyoto (JP); Yoshitaka Matsukawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 16/581,942

(22) Filed: Sep. 25, 2019

(65) Prior Publication Data
US 2020/0020605 A1    Jan. 16, 2020

Related U.S. Application Data

(63) Continuation of application No. PCT/JP2018/013552, filed on Mar. 30, 2018.

(30) Foreign Application Priority Data

Mar. 31, 2017 (JP) .............................. JP2017-069691

(51) Int. Cl.
*H01L 23/367* (2006.01)
*H01L 23/31* (2006.01)
(Continued)

(52) U.S. Cl.
CPC ........ *H01L 23/3675* (2013.01); *H01L 23/315* (2013.01); *H01L 23/3121* (2013.01);
(Continued)

(58) Field of Classification Search
CPC ............. H01L 23/3675; H01L 23/3121; H01L 23/315; H01L 23/5383; H01L 23/5386; H01L 23/552; H01L 25/0655
See application file for complete search history.

(56) References Cited

U.S. PATENT DOCUMENTS

2010/0096747 A1* 4/2010 Kusano ............. H01L 23/49816
                                                                257/706
2015/0221625 A1   8/2015 Chun et al.
2016/0338228 A1* 11/2016 Suzuki .................... H01L 24/48

FOREIGN PATENT DOCUMENTS

JP        H04-59949 U      5/1992
JP        2003-224234 A    8/2003
(Continued)

OTHER PUBLICATIONS

International Search Report for International Application No. PCT/JP2018/013552, dated Jun. 12, 2018.
(Continued)

*Primary Examiner* — Herve-Louis Y Assouman
(74) *Attorney, Agent, or Firm* — Pearne & Gordon LLP

(57) ABSTRACT

A module includes a substrate, a first component on a first main surface of the substrate and from which heat is to be dissipated, a sealing resin layer that encloses the first component, and a heat-dissipating member that includes a first and a second heat-dissipating portions. The first heat-dissipating portion is disposed in the sealing resin layer, spaced apart from an upper surfaces of the first component, and includes a first overlap portion that overlaps an upper surfaces of the first component when viewed in plan in a direction perpendicular to the first main surface. The second heat-dissipating portion extends from an undersurface of the first overlap portion to the upper surface of the first component. An area of the second heat-dissipating portion on a surface of the first overlap portion including the undersurface is smaller than an area of the first overlap portion.

5 Claims, 8 Drawing Sheets

(51) Int. Cl.
    *H01L 23/538*     (2006.01)
    *H01L 21/56*     (2006.01)
    *H01L 23/433*     (2006.01)
    *H01L 23/36*     (2006.01)
    *H01L 25/04*     (2014.01)
    *H01L 25/18*     (2006.01)
    *H01L 23/552*     (2006.01)
    *H01L 25/065*     (2006.01)
    *H01L 21/48*     (2006.01)
    *H01L 21/78*     (2006.01)
    *H01L 23/00*     (2006.01)
    *H01L 25/00*     (2006.01)

(52) U.S. Cl.
    CPC ...... *H01L 23/5383* (2013.01); *H01L 23/5386* (2013.01); *H01L 23/552* (2013.01); *H01L 25/0655* (2013.01); *H01L 21/4853* (2013.01); *H01L 21/4857* (2013.01); *H01L 21/561* (2013.01); *H01L 21/565* (2013.01); *H01L 21/78* (2013.01); *H01L 24/16* (2013.01); *H01L 24/81* (2013.01); *H01L 24/97* (2013.01); *H01L 25/50* (2013.01); *H01L 2224/16227* (2013.01); *H01L 2224/16235* (2013.01); *H01L 2224/16238* (2013.01); *H01L 2224/81815* (2013.01); *H01L 2924/3025* (2013.01)

(56) References Cited

FOREIGN PATENT DOCUMENTS

| | | |
|---|---|---|
| JP | 2007-066960 A | 3/2007 |
| JP | 2012-028484 A | 2/2012 |
| JP | 5544906 B2 | 7/2014 |

OTHER PUBLICATIONS

Written Opinion for International Application No. PCT/JP2018/013552, dated Jun. 12, 2018.

* cited by examiner

MODULE INCLUDING HEAT DISSIPATION STRUCTURE

This is a continuation of International Application No. PCT/JP2018/013552 filed on Mar. 30, 2018 which claims priority from Japanese Patent Application No. 2017-069691 filed on Mar. 31, 2017. The contents of these applications are incorporated herein by reference in their entireties.

BACKGROUND

Technical Field

The present disclosure relates to a module having a heat dissipation structure.

A module including a substrate having a mount surface on which a heat-generating component is mounted may have a heat dissipation mechanism to prevent the component from having its characteristic fluctuated or being damaged due to a temperature rise during the use of the component. Examples of a module that has such a heat dissipation mechanism include an electronic device 100 described in Patent Document 1, illustrated in FIG. 8.

The electronic device 100 includes a printed circuit board 101 on which electronic components 102a, 102b, and 102c are mounted, a heat sink 103 that dissipates heat generated from the electronic components 102a, 102b, and 102c to the outside, and a mold resin 104 filled in a space between the printed circuit board 101 and the heat sink 103. Between the heat sink 103 and the electronic components 102a, 102b, and 102c, heat conductive bumps 105 having a height larger than the height difference between the mount heights of the electronic components 102a, 102b, and 102c are arranged while being compressed. The heat conductive bumps 105 thermally couple the electronic components 102a, 102b, and 102c and the heat sink 103 together.

Patent Document 1: Japanese Patent No. 5544906 (paragraph 0032, refer to FIG. 1)

BRIEF SUMMARY

However, the electronic device 100 has a structure in which the heat sink 103 is disposed on the upper surface of the mold resin 104. Thus, the heat conductive bumps 105 are long, so that it takes a long time to transmit the heat generated by the electronic components 102a, 102b, and 102c to the heat sink 103 through the heat conductive bumps 105. This structure may thus fail to achieve a sufficient heat dissipation effect.

The present disclosure is made in view of the above problem, and aims to provide a module that can improve a heat dissipation effect while preventing a component mounted on a substrate from having its characteristic fluctuated or being damaged due to a temperature rise during use of the component.

A module according to the present disclosure includes a substrate, a first component mounted on a first main surface of the substrate and from which heat is to be dissipated, a sealing resin layer that encloses the first components therein, and a heat-dissipating member that includes a first heat-dissipating portion and a second heat-dissipating portion. The sealing resin layer includes a first recess in a surface opposite to a surface facing the first main surface, and a second recess that extends from the first recess toward the first main surface. The first heat-dissipating portion is disposed in the first recess of the sealing resin layer while being spaced apart from an opposite surface of the first component opposite to a mount surface, and the first heat-dissipating portion includes a first overlap portion that overlaps at least the opposite surface of the first component when viewed in a plan in a direction perpendicular to the first main surface. The second heat-dissipating portion is disposed in the second recess of the sealing resin layer, and extends from a surface of the first overlap portion facing the first component toward the opposite surface of the first component. An area of the second heat-dissipating portion on a surface of the first overlap portion including the surface facing the first component is smaller than an area of the first overlap portion.

In this structure, when viewed in a plan in a direction perpendicular to a first main surface, an area over which the second heat-dissipating portion and the opposite surface of the first component overlap each other is smaller than an area over which the first overlap portion of the first heat-dissipating portion and the opposite surface of the first component overlap each other. Thus, the first component is prevented from being damaged while the second heat-dissipating portion is formed. Furthermore, the first overlap portion of the first heat-dissipating portion is disposed in the first recess of the sealing resin layer while being spaced apart from the opposite surface of the first component. Thus, compared to an existing technology where a heat sink is disposed on the upper surface of the sealing resin layer, a distance between the first overlap portion of the first heat-dissipating portion and the first component is reduced. Thus, heat generated by the first component is immediately transmitted to the first heat-dissipating portion having a surface area larger than a surface area of the second heat-dissipating portion via the second heat-dissipating portion. Thus, the heat dissipation effect is enhanced.

The module may further include a second component mounted on the first main surface and from which heat is not to be dissipated. The first heat-dissipating portion may be spaced apart from an opposite surface of the second component opposite to a mount surface, and may include a second overlap portion that overlaps at least the opposite surface of the second component when viewed in a plan in a direction perpendicular to the first main surface. A shortest distance from a surface of the second overlap portion facing the second component to the opposite surface of the second component may be larger than a shortest distance from the surface of the first overlap portion facing the first component to the opposite surface of the first component. In this structure, the surface area of the first heat-dissipating portion is increased, so that the heat dissipation effect is further enhanced. In addition, the shortest distance from the surface of the second overlap portion facing the second component to the opposite surface of the second component is larger than the shortest distance from the surface of the first overlap portion facing the first component to the opposite surface of the first component. Thus, heat generated by the first component is less easily transmitted to the second component via the second heat-dissipating portion and the first heat-dissipating portion, so that the second component is less easily affected by the heat generated by the first component.

The module may further include a second component mounted on the first main surface and from which heat is not to be dissipated. The first heat-dissipating portion may be located substantially throughout a region overlapping the first main surface excluding a region overlapping an opposite surface of the second component opposite to a mount surface of the second component when viewed in a plan in a direction perpendicular to the first main surface. In this structure, the surface area of the first heat-dissipating portion is increased and the heat dissipation effect is further enhanced.

The module may further include a second component mounted on the first main surface and from which heat is not to be dissipated. The first heat-dissipating portion includes an inter-component overlap portion that faces the first main surface and that overlaps at least a region between the first component and the second component when viewed in a plan in a direction perpendicular to the first main surface. The heat-dissipating member may further include a heat-transfer portion that extends from a surface of the inter-component overlap portion facing the first main surface toward the first main surface to be located between the first component and the second component. A shortest distance between the first component and the heat-transfer portion may be smaller than a shortest distance between the second component and the heat-transfer portion. In this structure, the heat-transfer portion is located between the first component and the second component and closer to the first component than the second component. Thus, heat generated by the first component is absorbed by the heat-transfer portion and dissipated from the heat-dissipating member, so that the second component is less easily affected by the heat generated by the first component.

In the module, the first heat-dissipating portion may include an inter-component overlap portion that faces the first main surface and that overlaps at least a region between the first component and the second component when viewed in a plan in a direction perpendicular to the first main surface. The heat-dissipating member may further include a heat-transfer portion that extends from a surface of the inter-component overlap portion facing the first main surface toward the first main surface to be located between the first component and the second component. A shortest distance between the first component and the heat-transfer portion may be smaller than a shortest distance between the second component and the heat-transfer portion. In this structure, the heat-transfer portion is located between the first component and the second component and closer to the first component than the second component. Thus, heat generated by the first component is absorbed by the heat-transfer portion and dissipated from the heat-dissipating member, so that the second component is less easily affected by the heat generated by the first component.

In the module, the heat-transfer portion may have a shape of a frame that surrounds the first component and that is located on an outer side portion of at least one side of the first component facing the second component when viewed in a plan in a direction perpendicular to the first main surface. In this structure, the heat-transfer portion separates the first component from the second component, so that the second component is less easily affected by the heat generated by the first component.

According to the present disclosure, the first heat-dissipating portion is disposed in the first recess of the sealing resin layer while being spaced apart from the opposite surface of the first component, and the first heat-dissipating portion includes a first overlap portion that overlaps at least the opposite surface of the first component when viewed in a plan in a direction perpendicular to the first main surface. The second heat-dissipating portion extends from a surface of the first overlap portion facing the first component toward the opposite surface of the first component. An area of the second heat-dissipating portion on a surface of the first overlap portion including the surface facing the first component is smaller than an area of the first overlap portion. Thus, when viewed in a plan in a direction perpendicular to a first main surface, an area over which the second heat-dissipating portion and the opposite surface of the first component overlap each other is smaller than an area over which the first overlap portion of the first heat-dissipating portion and the opposite surface of the first component overlap each other. Thus, the first component is prevented from being damaged while the second heat-dissipating portion is formed. Furthermore, the first overlap portion of the first heat-dissipating portion is disposed in the first recess of the sealing resin layer while being spaced apart from the opposite surface of the first component. Thus, compared to an existing technology where a heat sink is disposed on the upper surface of the sealing resin layer, a distance between the first overlap portion of the first heat-dissipating portion and the first component is reduced. Thus, heat generated by the first component is immediately transmitted to the first heat-dissipating portion having a surface area larger than a surface area of the second heat-dissipating portion via the second heat-dissipating portion. Thus, the heat dissipation effect is enhanced.

DETAILED DESCRIPTION

First Embodiment

Figure 1A:
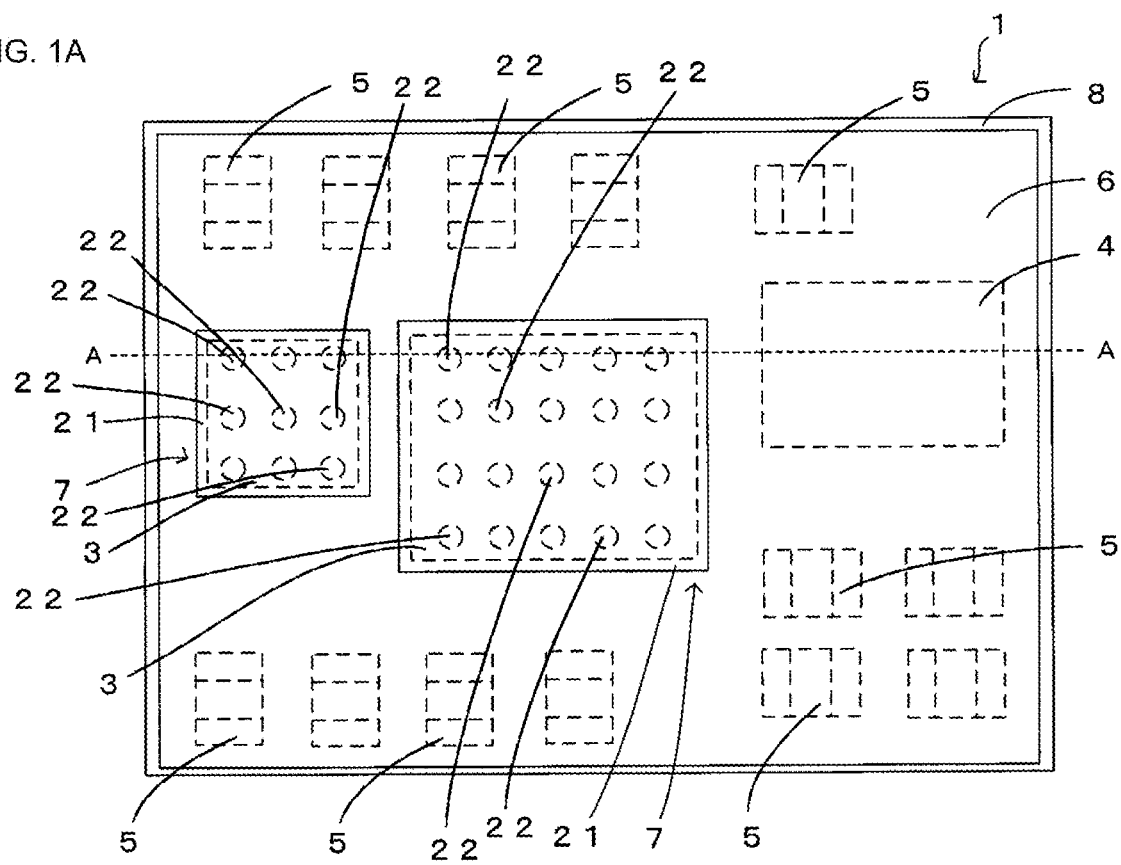
FIG. 1A is a plan view of a module according to a first embodiment of the present disclosure excluding an upper surface portion of a shield layer.
Figure 1B:
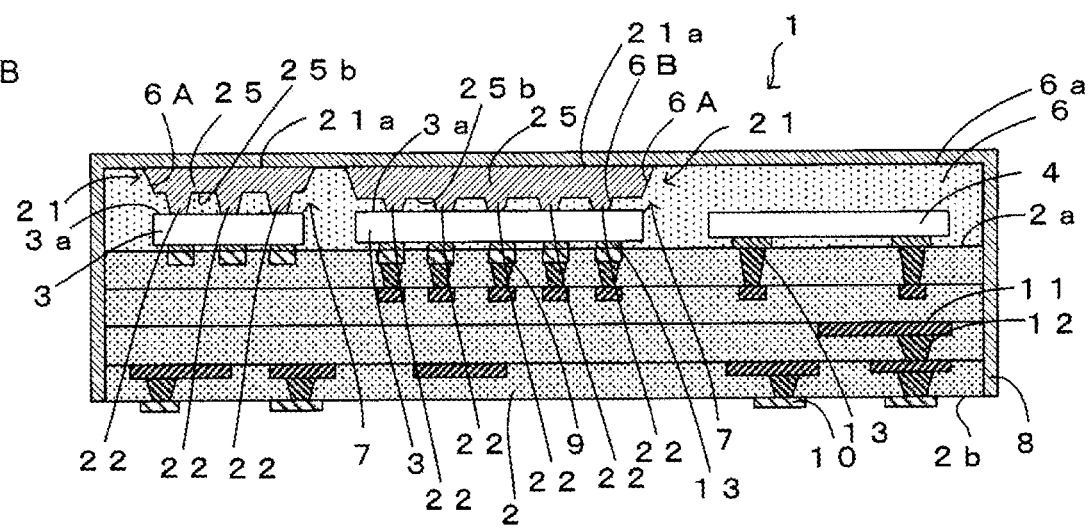
FIG. 1B is a cross-sectional view of the module taken along line A-A in FIG. 1A including the upper surface portion of the shield layer.

A module 1 according to a first embodiment of the present disclosure will be described with reference to FIGS. 1A and 1B. FIG. 1A is a plan view of a shield layer 8 of the module 1 according to the first embodiment excluding an upper surface portion, and FIG. 1B is a cross-sectional view of the module taken along line A-A in FIG. 1A including the upper surface portion of the shield layer 8.

The module 1 according to the first embodiment is mounted on, for example, a motherboard of an electronic device. The module 1 includes a substrate 2, two first components 3, one second component 4, and thirteen third components 5, which are mounted on a first main surface 2a of the substrate 2, a sealing resin layer 6 that encloses components including the first components 3, the second component 4, and the third components 5 therein, two heat-dissipating members 7 disposed in the sealing resin layer 6, and a shield layer 8 disposed to cover an upper surface 6a, described below, and side surfaces of the sealing resin layer 6, upper surfaces 21a of first heat-dissipating portions 21, described below, of the heat-dissipating members 7, and side surfaces of the substrate 2. The numbers of the first components 3, the second component 4, and the third components 5 are mere examples, and not limited to these. The shield layer 8 is not necessarily indispensable.

The substrate 2 is made of, for example, any of low-temperature co-fire ceramics or glass epoxy resin. Multiple land electrodes 9 are disposed on a first main surface 2a of the substrate 2, and multiple external electrodes 10 are disposed on a second main surface 2b of the substrate 2. Multiple electrodes (interconnection electrodes and ground electrodes) 11 and via conductors 12 are disposed inside the substrate 2. For example, the land electrodes 9 are connected to the electrodes (interconnection electrodes and ground electrodes) 11 via the via conductors 12, and the external electrodes 10 are connected to the electrodes (interconnection electrodes and ground electrodes) 11 via the via conductors 12. The ground electrodes are exposed to the outside from the side surfaces of the substrate 2 to be in contact with the shield layer 8.

The land electrodes 9, the external electrodes 10, and the electrodes (interconnection electrodes and ground electrodes) 11 are made of metal generally employed as electrodes such as Cu, Ag, or Al. The via conductors 12 are made of metal such as Ag or Cu.

The first components 3 are heat generating components that require heat dissipation. The first components 3 are mounted on the first main surface 2a of the substrate 2 with, for example, their connection terminals connected to the land electrodes 9 disposed on the first main surface 2a of the substrate 2 via solder portions 13. The second component 4 is a component not requiring heat dissipation, and has its characteristics susceptible to the effect of heat generated by, for example, the first components 3. The second component 4 is mounted on the first main surface 2a of the substrate 2 with, for example, its connection terminal connected via the solder portions 13 to exposed surfaces of the via conductors 12 on the first main surface 2a of the substrate 2. The third components 5 are components not requiring heat dissipation, and have their characteristics susceptible to the effect of heat generated by, for example, the first components 3. As in the second component 4, the third components 5 are also mounted on the first main surface 2a of the substrate 2. Here, examples of heat generating components include a semiconductor device such as an IC element or a power amplifier. Some types of IC element generate a large amount of heat, while others do not depend on the circuit design or circuit function. The amount of heat generated by passive elements such as an inductor, capacitor, or filter is small, and does not generally cause a problem. However, with increasing size reduction, these passive elements have reduced the surface areas through which they dissipate heat. Thus, heat generation of these passive elements may cause a problem depending on high-density packaging of components or the circuit design. The first components 3 thus may cause a heat generation problem.

The sealing resin layer 6 has recesses 6A, in the surface opposite to the first main surface 2a, and recesses 6B. The recesses 6A receive first overlap portions 25 of the first heat-dissipating portions 21 of the heat-dissipating members 7. The recesses 6B receive second heat-dissipating portions 22 of the heat-dissipating members 7. The first heat-dissipating portions 21 and the second heat-dissipating portions 22 are described below. The sealing resin layer 6 covers the first main surface 2a, the first components 3, the second component 4, and the third components, and also covers the heat-dissipating members 7 excluding the upper surfaces 21a of the first heat-dissipating portions 21, described below, of the heat-dissipating members 7 to enclose the first main surface 2a, the first components 3, the second component 4, the third components 5, and the heat-dissipating members 7. The sealing resin layer 6 can be made of a resin generally employed as a sealing resin such as an epoxy resin to which a silica filler is added. Instead, a resin such as an epoxy resin to which a highly thermally conductive filler such as an alumina filler is added may be used as the sealing resin layer 6 for high heat conduction.

Each of the heat-dissipating members 7 includes the first heat-dissipating portion 21 and the multiple second heat-dissipating portions 22, and is made of a heat conductive material (for example, a highly heat conductive material such as metal).

When viewed in a plan in a direction perpendicular to the first main surface 2a of the substrate 2, the first heat-dissipating portions 21 are disposed over surfaces of the first components 3 opposite to the surfaces facing the first main surface 2a, that is, over surfaces 3a opposite to mount surfaces (the surfaces 3a are referred to as "upper surfaces", below), and in surrounding regions of the upper surfaces 3a. The first heat-dissipating portions 21 are disposed in the recesses 6A of the sealing resin layer 6 while being spaced apart from the upper surfaces 3a of the first components 3. Each of the first heat-dissipating portions 21 includes a first overlap portion 25 that overlaps at least the upper surface 3a of the corresponding first component 3 when viewed in a plan in a direction perpendicular to the first main surface 2a of the substrate 2. The surface 21a of each first heat-dissipating portion 21 disposed parallel to the first main surface 2a and located furthest from the first main surface 2a (hereinafter referred to as "an upper surface") is on the same plane as a surface 6a of the sealing resin layer 6 disposed parallel to the first main surface 2a and located furthest from the first main surface 2a (hereinafter referred to as "an upper surface"), and exposed from the upper surface 6a of the sealing resin layer 6. In order that a surface 25b of the first overlap portion 25 disposed parallel to the first main surface 2a and located closest to the first main surface 2a (hereinafter referred to as "an undersurface") does not come into contact with the upper surfaces 3a of the first components 3, a distance from the first main surface 2a to the undersurface 25b of the first overlap portion 25 is larger than a distance from the first main surface 2a to the upper surfaces 3a of the first components 3.

The multiple second heat-dissipating portions 22 are arranged in the recesses 6B of the sealing resin layer 6 in a matrix on the undersurface 25b of the first overlap portion 25. Each of the second heat-dissipating portions 22 has a substantially cylindrical shape, and extends from the undersurface 25b of the first overlap portion 25 toward the first component 3 to the upper surface 3a of the first component 3 to be in contact with the upper surface 3a of the first component 3. The second heat-dissipating portions 22 are considered to be substantially cylindrical shape when a deviation of any of the contour of the second heat-dissipating portions 22 is within 10% of a cylindrical shape. Here, each of the second heat-dissipating portions 22 may be kept apart from the upper surface 3a of the first component 3. The area of each of the second heat-dissipating portions 22 on the surface including the undersurface 25b of the first overlap portion 25 is smaller than the area of the first overlap portion 25. The undersurface 25b of the first overlap portion 25 corresponds to "a surface of a first overlap portion facing a first component" of the present disclosure. Specifically, "a heat-dissipating member" in the present embodiment has a two-layered structure including "a first heat-dissipating portion" disposed in a corresponding recess 6A in an upper surface 6a of the sealing resin layer 6, and "second heat-dissipating portions" partially disposed in the recesses 6B to extend from the first heat-dissipating portion toward the first components. Thus, the heat-dissipating member according to the present embodiment has a layered structure.

Among the two first components 3, the shortest distance between the upper surface 3a of one of the first components 3 illustrated at substantially the center in FIG. 1B and the undersurface 25b of the one of the first overlap portions 25 illustrated at substantially the center in FIG. 1B is smaller than the shortest distance between the upper surface 3a of the other first component 3 and the undersurface 25b of the other first overlap portion 25. For the two first components 3 requiring heat dissipation, the distance between the upper surface 3a of each of the first components 3 and the undersurface 25b of the corresponding first overlap portion 25 is varied depending on the necessity of heat dissipation to reduce the distance between the first component 3 further requiring heat dissipation and the corresponding first overlap portion 25. For the two first components 3 requiring heat dissipation, the distance between the upper surface 3a of each of the first components 3 and the undersurface 25b of the corresponding first overlap portion 25 may remain the same regardless of the necessity of heat dissipation.

In the module 1, when viewed in a plan in a direction perpendicular to the first main surface 2a, the heat-dissipating members 7 are not disposed at portions overlapping the second component 4, and the heat-dissipating members 7 are not disposed at portions overlapping the third components 5.

In the first embodiment, the multiple second heat-dissipating portions 22 of the heat-dissipating members 7 are arranged in a matrix on the undersurface 25b of the first overlap portion 25, but may be arranged in another form.

The second heat-dissipating portions 22 have a substantially cylinder shape, but may have a shape other than the substantially cylinder shape, such as a substantially quadrangular prism shape.

Instead of respectively providing the heat-dissipating members 7 for the two first components 3, one heat-dissipating member that overlaps a component region including the upper surfaces 3a of the first components 3 when viewed in a plan in a direction perpendicular to the first main surface 2a may be provided. Here, one heat-dissipating member includes a first heat-dissipating portion and multiple second heat-dissipating portions. The first heat-dissipating portion is disposed for the two first components 3 in the recess 6A in the sealing resin layer 6 while being spaced apart from the upper surfaces 3a of the first components 3, and includes first overlap portions that overlap at least the upper surfaces 3a of the first components 3 when viewed in a plan in a direction perpendicular to the first main surface 2a of the substrate 2. In each of the two first overlap portions, the multiple second heat-dissipating portions are arranged in a matrix on the undersurface of the first overlap portion. Each of the second heat-dissipating portions may extend from the undersurface of the corresponding first overlap portion to the upper surface 3a of the first component 3 to be in contact with the upper surface 3a of the corresponding first component 3. Instead, each of the second heat-dissipating portions may be kept apart from the upper surface 3a of the first component 3.

The shield layer 8 is in contact with and covers the upper surface 6a and the side surfaces of the sealing resin layer 6, the upper surfaces 21a of the first heat-dissipating portions 21 of the heat-dissipating members 7, and the side surfaces of the substrate 2. The shield layer 8 prevents unnecessary electromagnetic waves emitted from external devices from arriving at, for example, the first components 3, the second component 4, and the third components 5 of the module 1, or prevents unnecessary electromagnetic waves emitted from, for example, the first components 3, the second component 4, and the third components 5 of the module 1 from leaking to the outside.

The shield layer 8 may have a multilayer structure including, for example, a close contact layer, an electroconductive layer laminated on the close contact layer, and a corrosion resistant layer laminated on the electroconductive layer. The close contact layer is laminated on the upper surface 6a and the side surfaces of the sealing resin layer 6, the upper surfaces 21a of the first heat-dissipating portions 21 of the heat-dissipating members 7, and the side surfaces of the substrate 2. The close contact layer is disposed to enhance the adhesive strength between itself and, for example, the electroconductive layer and the sealing resin layer 6, and can be made of, for example, metal such as stainless steel. The electroconductive layer is a layer in the shield layer 8 that has a substantially shielding function and that can be made of, for example, any of Cu, Ag, and Al. The corrosion resistant layer is disposed to prevent the electroconductive layer from being corroded or damaged, and can be made of, for example, stainless steel. The shield layer 8 may be formed by, for example, sputtering, vapor deposition, or paste application.

(Method for Manufacturing Module)

Now, a method for manufacturing the module 1 will be described.

Firstly, multiple land electrodes 9 are formed on the first main surface 2a, multiple external electrodes 10 are formed on the second main surface 2b, and an assembly of the substrate 2 in which components including multiple electrodes (interconnection electrodes and ground electrodes) 11 and multiple via conductors 12 are formed is prepared. The land electrodes 9, the external electrodes 10, and the electrodes (interconnection electrodes and ground electrodes) 11 can be formed by, for example, screen printing with an electroconductive paste containing metal such as Cu, Ag, or Al. The via conductors 12 can be formed by forming via holes with a laser or other devices and then by a known method.

Subsequently, two first components 3, one second component 4, and thirteen third components 5 are mounted on the first main surface 2a of the substrate 2 by a known surface mount technology. For example, solder portions 13 are formed on intended ones of the land electrodes 9, and each of the first components 3 is mounted on the corresponding ones of the land electrodes 9 on which the solder portions 13 are formed. After the first components 3 are mounted, reflow soldering is performed. In addition, for example, solder portions 13 are formed on intended ones of the surfaces of the via conductors 12 formed in the substrate 2 exposed from the first main surface 2a, and the second component 4 is mounted on the corresponding ones of the surfaces, exposed from the first main surface 2a, of the via conductors 12 on which the solder portions 13 are formed. After the second component 4 is mounted, reflow soldering is performed. The third components 5 are mounted in the same manner as in the second component 4, and reflow soldering is performed after the third components 5 are mounted. An assembly of the substrate 2 is cleaned as needed after reflow soldering.

Subsequently, to cover the first main surface 2a of the substrate 2 and the first components 3, the second component 4, and the third components 5 mounted on the first main surface 2a, a temporary sealing resin layer serving as the base for the sealing resin layer 6 is formed on the first main surface 2a of the substrate 2. The temporary sealing resin layer can be formed by, for example, transfer molding, compression molding, liquid resin treatment, or sheet resin treatment. Here, resin generally employed as a sealing resin such as an epoxy resin to which a general silica filler is added may be used as the temporary sealing resin layer. To make the temporary sealing resin layer to have high thermal conductivity, a resin such as an epoxy resin to which a filler having high thermal conductivity such as an alumina filler is added may be used. The assembly of the substrate 2 is subjected to plasma cleaning as needed before the temporary sealing resin layer is formed.

Subsequently, the upper surfaces 3a of the first components 3 and the surrounding region on the surface of the temporary sealing resin layer opposite to the surface facing the first main surface 2a when viewed in a plan in a direction perpendicular to the first main surface 2a are irradiated with laser beams to remove resin from a portion not arriving at the upper surfaces 3a of the first components 3 to form the recesses 6A in which the first heat-dissipating portions 21 are to be formed. In addition, the bottom surface of each recess 6A is irradiated with laser beams at multiple portions facing the upper surface 3a of the corresponding first component 3 to remove resin from the portions not arriving at the upper surface 3a of the first component 3 to form the recesses 6B in which the second heat-dissipating portions 22 are to be formed. Thus, the sealing resin layer 6 having the recesses for receiving the heat-dissipating members 7 is formed. Examples usable as the laser beams here include UV laser beams, $CO_2$ laser beams, YAG laser beams, and green laser beams.

Subsequently, the recesses in the sealing resin layer 6 that receive the heat-dissipating members 7 are filled with a heat conductive material (for example, highly heat-conductive material such as metal). The recess 6A and the recess 6B are basically filled with the same heat conductive material. However, the recess 6A and the recess 6B may be filled with different heat conductive materials. Thus, for each first component 3, the heat-dissipating member 7 including the first heat-dissipating portion 21 and the multiple second heat-dissipating portions 22 is formed.

Subsequently, the module 1 without necessarily the shield layer 8 is divided into individual pieces by a dicer or laser processing.

Subsequently, on each of the individual pieces of the module 1 without the shield layer 8, the shield layer 8 is formed to be in contact with and to cover the upper surface 6a and the side surfaces of the sealing resin layer 6, the upper surfaces 21a of the first heat-dissipating portions 21 of the heat-dissipating members 7, and the side surfaces of the substrate 2. The shield layer 8 can be formed by, for example, sputtering, vapor deposition, or paste application.

In the above first embodiment, the first heat-dissipating portions 21 are disposed in the recesses 6A in the sealing resin layer 6 while being spaced apart from the upper surfaces 3a of the first components 3. Each of the first heat-dissipating portions 21 includes the first overlap portion 25 that overlaps at least the upper surface 3a of the first component 3 when viewed in a plan in a direction perpendicular to the first main surface 2a. Each of the second heat-dissipating portions 22 extends from the undersurface 25b of the corresponding first overlap portion 25 to the upper surface 3a of the corresponding first components 3. The area of the second heat-dissipating portions 22 on the surface containing the undersurface 25b of the first overlap portion 25 is smaller than the area of the first overlap portion 25. Thus, compared to the case where the sealing resin layer 6 corresponding to the upper surface 3a of the first component 3 is removed as a whole, the first components 3 are prevented from being damaged while the recesses 6B for receiving the second heat-dissipating portions 22 are formed. The first overlap portions 25 of the first heat-dissipating portions 21 are disposed in the recesses 6A in the sealing resin layer 6 while being spaced apart from the upper surfaces 3a of the first components 3. Thus, compared to the case where a heat sink is disposed on the upper surface of the sealing resin layer as in an existing technology, the distance between the first overlap portion 25 of each of the first heat-dissipating portions 21 and the corresponding first component 3 is reduced. Thus, the heat generated from each first component 3 is immediately transmitted to the first heat-dissipating portion 21 having a surface area larger than the surface area of the second heat-dissipating portions 22 via the second heat-dissipating portions 22. Thus, the heat dissipation effect can be improved.

When viewed in a plan in a direction perpendicular to the first main surface 2a, the heat-dissipating members 7 do not overlap the surface of the second component 4 opposite to the surface facing the first main surface 2a or the surfaces of the third components 5 opposite to the surfaces facing the first main surface 2a. Thus, heat generated by the first components 3 is less easily transmitted to the second component 4 and the third components 5 via the second heat-dissipating portions 22 and the first heat-dissipating portions 21. Thus, the second component 4 and the third components 5 are less easily affected by the heat generated by the first components 3. Thus, the second component 4 and the third components 5 can be prevented from having their characteristics fluctuated or their performance deteriorated due to a temperature rise.

The heat-dissipating members 7 can be appropriately arranged corresponding to the first components 3 requiring heat dissipation to improve heat dissipation. The multiple second heat-dissipating portions 22 are disposed in the form of wedges into the sealing resin layer 6. Thus, the sealing resin layer 6 and the second heat-dissipating portions 22 can be prevented from being detached from each other, so that the shield layer 8 can be prevented from being disconnected due to detachment between the sealing resin layer 6 and the second heat-dissipating portions 22.

In the structure of Patent Document 1, the heat conductive bumps 105 are in contact with the electronic components 102a, 102b, and 102c while being compressed. Thus, the electroconductive component of the heat conductive bumps 105 may spread to the mount surfaces of the contact electronic components 102a, 102b, and 102c, to cause defects such as a short-circuit in the electronic components 102a, 102b, and 102c, or degrade the reliability of the electronic components 102a, 102b, and 102c. In the module 1, on the other hand, the electroconductive component of the second heat-dissipating portions 22 less easily spreads to the circuit surfaces of the first components 3, and thus less easily causes defects such as a short-circuit in the first components 3. Thus, the reliability of the first components 3 less easily degrades.

Second Embodiment

Figure 2A:
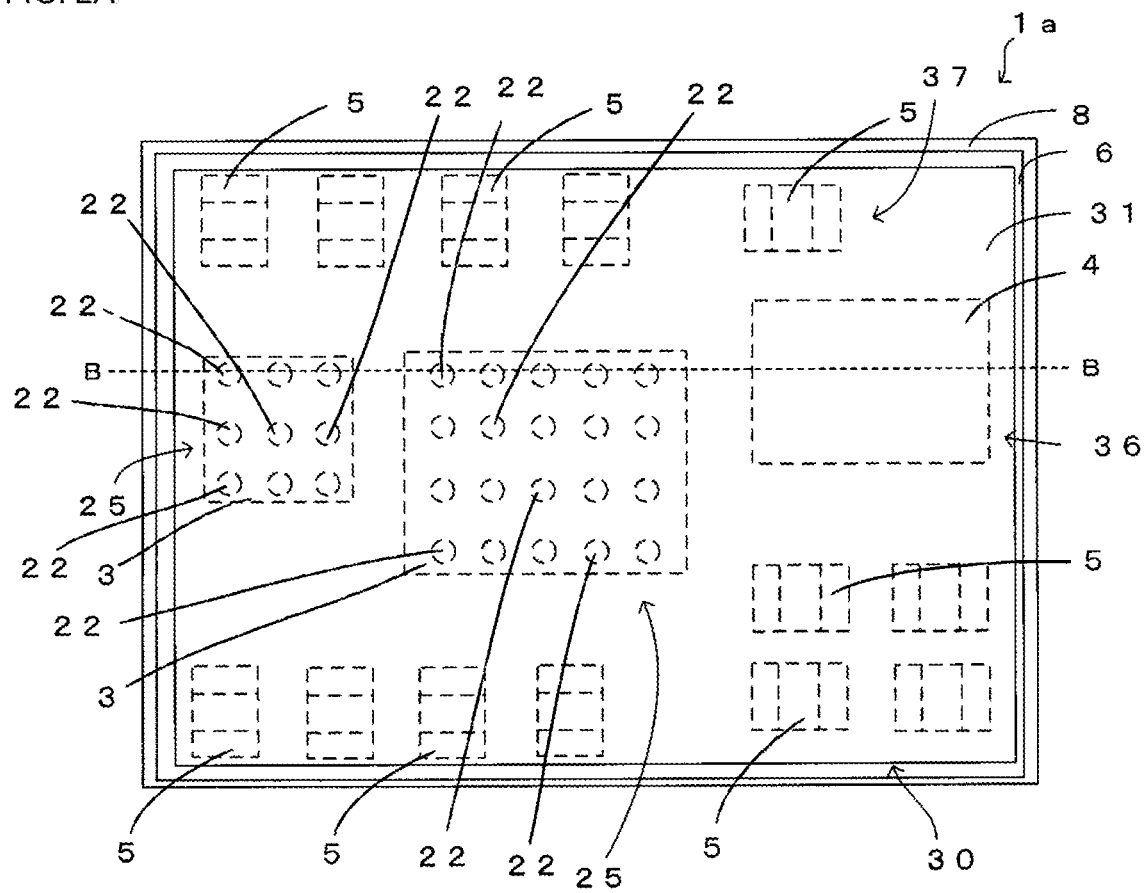
FIG. 2A is a plan view of a module according to a second embodiment of the present disclosure excluding an upper surface portion of a shield layer.
Figure 2B:
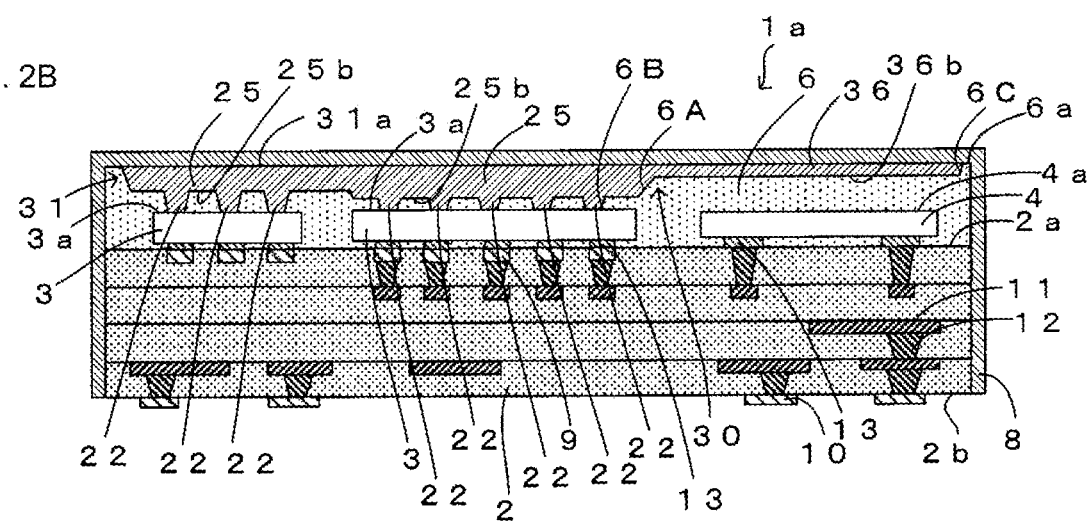
FIG. 2B is a cross-sectional view of the module taken along line B-B in FIG. 2A including the upper surface portion of the shield layer.

A module 1a according to a second embodiment of the present disclosure will now be described with reference to FIGS. 2A and 2B. FIG. 2A is a plan view of the module 1a according to the second embodiment excluding the upper surface portion of the shield layer 8, and FIG. 2B is a cross-sectional view of the module taken along line B-B in FIG. 2A including the upper surface portion of the shield layer 8.

The module 1a according to the second embodiment is different from the module 1 according to the first embodiment described with reference to FIGS. 1A and 1B in that, as illustrated in FIG. 2A, when viewed in a plan in a direction perpendicular to the first main surface 2a, a heat-dissipating member 30 has a portion that overlaps a surface 4a (hereinafter referred to as "an upper surface") of the second component 4 opposite to the surface facing the first main surface 2a and a surface (hereinafter referred to as "an upper surface") of each of the third components 5 opposite to the surface facing the first main surface 2a. Other components are the same as those of the module 1 according to the first embodiment, and thus denoted with the same reference signs without necessarily being described.

The heat-dissipating member 30 includes a first heat-dissipating portion 31 and multiple second heat-dissipating portions 22, and is made of a heat conductive material (for example, a highly heat-conductive material such as metal). Second heat-dissipating portions 22 according to the second embodiment have the same structure as that of the second heat-dissipating portions 22 according to the first embodiment.

When viewed in a plan in a direction perpendicular to the first main surface 2a of the substrate 2, the first heat-dissipating portion 31 is located over a region of the first main surface 2a excluding its peripheral edge portion. The first heat-dissipating portion 31 is disposed in the recesses 6A in the sealing resin layer 6 while being spaced apart from the upper surfaces 3a of the two first components 3. The first heat-dissipating portion 31 includes the first overlap portion 25 that overlaps at least the upper surfaces 3a of the first components 3 when viewed in a plan in a direction perpendicular to the first main surface 2a of the substrate 2. The first heat-dissipating portion 31 is disposed in the recesses 6A in the sealing resin layer 6 while being spaced apart from the upper surface 4a of the second component 4. The first heat-dissipating portion 31 includes a second overlap portion 36 that overlaps at least the upper surface 4a of the second component 4 when viewed in a plan in a direction perpendicular to the first main surface 2a of the substrate 2. The first heat-dissipating portion 31 is disposed in the recesses in the sealing resin layer 6 while being spaced apart from the upper surface of the thirteen third components. The first heat-dissipating portion 31 includes a third overlap portion 37 that overlaps at least the upper surfaces of the third components 5 when viewed in a plan in a direction perpendicular to the first main surface 2a of the substrate 2.

A surface 31a (hereinafter referred to as "an upper surface") of the first heat-dissipating portion 31 disposed parallel to the first main surfaces 2a and located furthest from the first main surface 2a is on the same plane as the upper surface 6a of the sealing resin layer 6, and exposed from the upper surface 6a of the sealing resin layer 6. In order that the undersurface 25b of each first overlap portion 25 does not come into contact with the upper surfaces 3a of the first components 3, the distance from the first main surface 2a to the undersurface 25b of the first overlap portion 25 is determined larger than the distance from the first main surface 2a to the upper surfaces 3a of the first components 3. In order that a surface 36b (hereinafter referred to as "an undersurface") of the second overlap portion 36 disposed parallel to the first main surface 2a and located closest to the first main surface 2a does not come into contact with the upper surface 4a of the second component 4, the distance from the first main surface 2a to the undersurface 36b of the second overlap portion 36 is determined larger than the distance from the first main surface 2a to the upper surface 4a of the second component 4. In order that the surface (hereinafter referred to as "an undersurface") of each third overlap portion 37 disposed parallel to the first main surface 2a and located closest to the first main surface 2a does not come into contact with the upper surface of the third components 5, the distance from the first main surface 2a to the undersurface of the third overlap portion 37 is determined larger than the distance from the first main surface 2a to the upper surfaces of the third components 5.

The shortest distance from the undersurface 36b of the second overlap portion 36 to the upper surface 4a of the second component 4 is larger than the shortest distance from the undersurface 25b of the first overlap portion 25 to the upper surfaces 3a of the first components 3. The shortest distance from the undersurface of the third overlap portion 37 to the upper surfaces of the third components 5 is larger than the shortest distance from the undersurface 25b of the first overlap portion 25 to the upper surfaces 3a of the first components 3.

The module 1a includes neither second heat-dissipating portions 22 that extend from the undersurface 36b of the second overlap portion 36 to the upper surface 4a of the second component 4, nor second heat-dissipating portions 22 that extend from the undersurface of the third overlap portion 37 to the upper surfaces of the third components 5.

According to the second embodiment, the first heat-dissipating portion 31 includes the second overlap portion 36, which overlaps at least the upper surface 4a of the second component 4 when viewed in a plan in a direction perpendicular to the first main surface 2a, and the third overlap portion 37, which overlaps at least the upper surface of the third components 5 for each of the third components 5 when viewed in a plan in a direction perpendicular to the first main surface 2a. Thus, the first heat-dissipating portion 31 has a large surface area and further improves the heat dissipation effect. In addition, the shortest distance from the undersurface 36b of the second overlap portion 36 to the upper surface 4a of the second component 4 is larger than the shortest distance from the undersurface 25b of the first overlap portion 25 to the upper surfaces 3a of the first components 3. Thus, heat generated by the first components 3 is less easily transmitted to the second component 4 through the second heat-dissipating portions 22 and the first heat-dissipating portion 31, so that the second component 4 is less easily affected by the heat generated by the first components 3. Thus, the second component 4 can be prevented from having its characteristic fluctuated or its performance deteriorated due to a temperature rise. Similarly, the shortest distance from the undersurface of the third overlap portion 37 to the upper surfaces of the third components 5 is larger than the shortest distance from the undersurface 25b of the first overlap portion 25 to the upper surfaces 3a of the first components 3. Thus, heat generated from the first components 3 is less easily transmitted to the third components 5 via the second heat-dissipating portions 22 and the first heat-dissipating portion 31, so that the third components 5 are less easily affected by the heat generated by the first components 3. Thus, the third components 5 are prevented from having their characteristic fluctuated or their performance deteriorated due to a temperature rise.

Modification Example 1

Figure 3A:
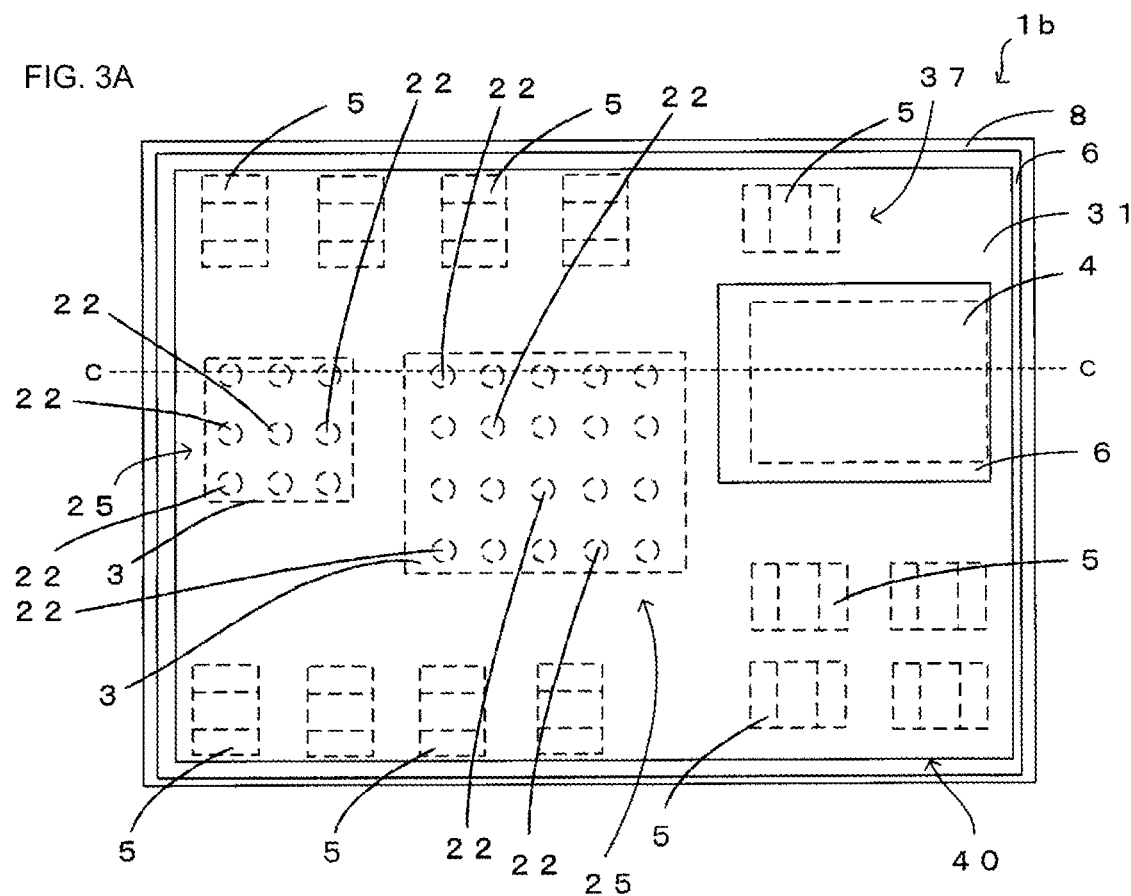
FIG. 3A is a plan view of a module according to modification example 1 of the second embodiment of the present disclosure excluding an upper surface portion of a shield layer.

A module 1b according to modification example 1 of the second embodiment according to the present disclosure will be described with reference to FIGS. 3A and 3B. FIG. 3A is a plan view of the module 1b according to modification example 1 of the second embodiment excluding the upper surface portion of the shield layer 8, and FIG. 3B is a cross-sectional view of the module taken along line C-C in FIG. 3A including the upper surface portion of the shield layer 8.

Figure 3B:
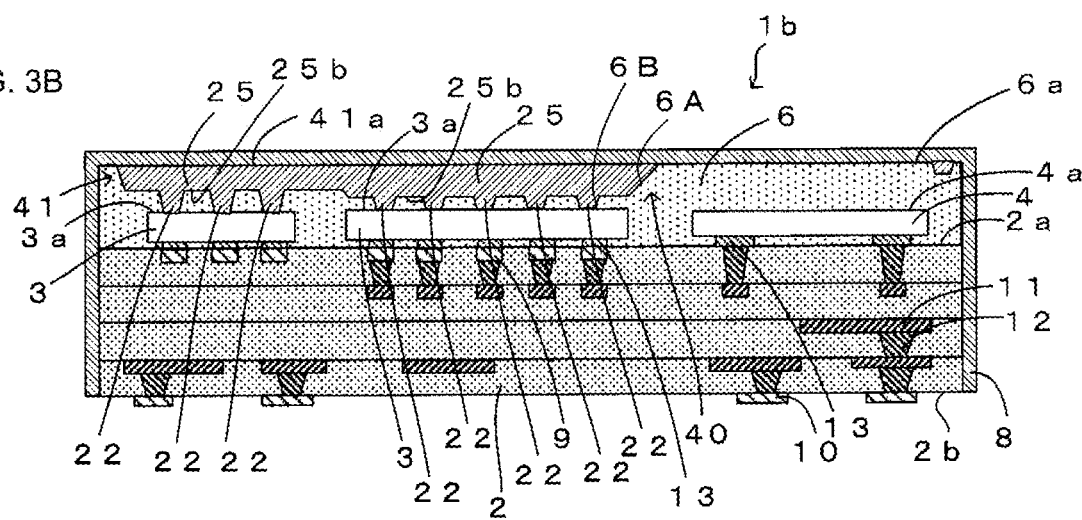
FIG. 3B is a cross-sectional view of the module taken along line C-C in FIG. 3A including the upper surface portion of the shield layer.

As illustrated in FIGS. 3A and 3B, the module 1b according to modification example 1 of the second embodiment is different from the module 1a according to the second embodiment illustrated in FIGS. 2A and 2B in that the heat-dissipating member 30 is replaced with a heat-dissipating member 40 including a first heat-dissipating portion 41 that excludes the portion of the first heat-dissipating portion 31 that overlaps the upper surface 4a of the second component 4 when viewed in a plan in a direction perpendicular to the first main surface 2a.

The heat-dissipating member 40 includes a first heat-dissipating portion 41 and multiple second heat-dissipating portions 22, and are made of a heat conductive material (for example, highly heat-conductive material such as metal). The second heat-dissipating portions 22 according to modification example 1 of the second embodiment have the same structure as the structure of the second heat-dissipating portions 22 according to the first embodiment.

The first heat-dissipating portion 41 is located over a region of the first main surface 2a excluding the peripheral edge portion of the first main surface 2a and excluding the upper surface 4a of the second component 4 and the surroundings of the upper surface 4a when viewed in a plan in a direction perpendicular to the first main surface 2a of the substrate 2. The first heat-dissipating portion 41 is disposed substantially the entire area of the region overlapping the first main surface 2a, excluding the region overlapping the upper surface 4a of the second component 4 when viewed in a plan in a direction perpendicular to the first main surface 2a. The first heat-dissipating portion 41 includes the first overlap portions 25 corresponding to the first components 3 and the third overlap portions 37 corresponding to the third components 5. A surface 41a of the first heat-dissipating portion 41 disposed parallel to the first main surface 2a and located furthest from the first main surface 2a is on the same plane as the upper surface 6a of the sealing resin layer 6, and exposed from the upper surface 6a of the sealing resin layer 6.

Third Embodiment

Figure 4A:
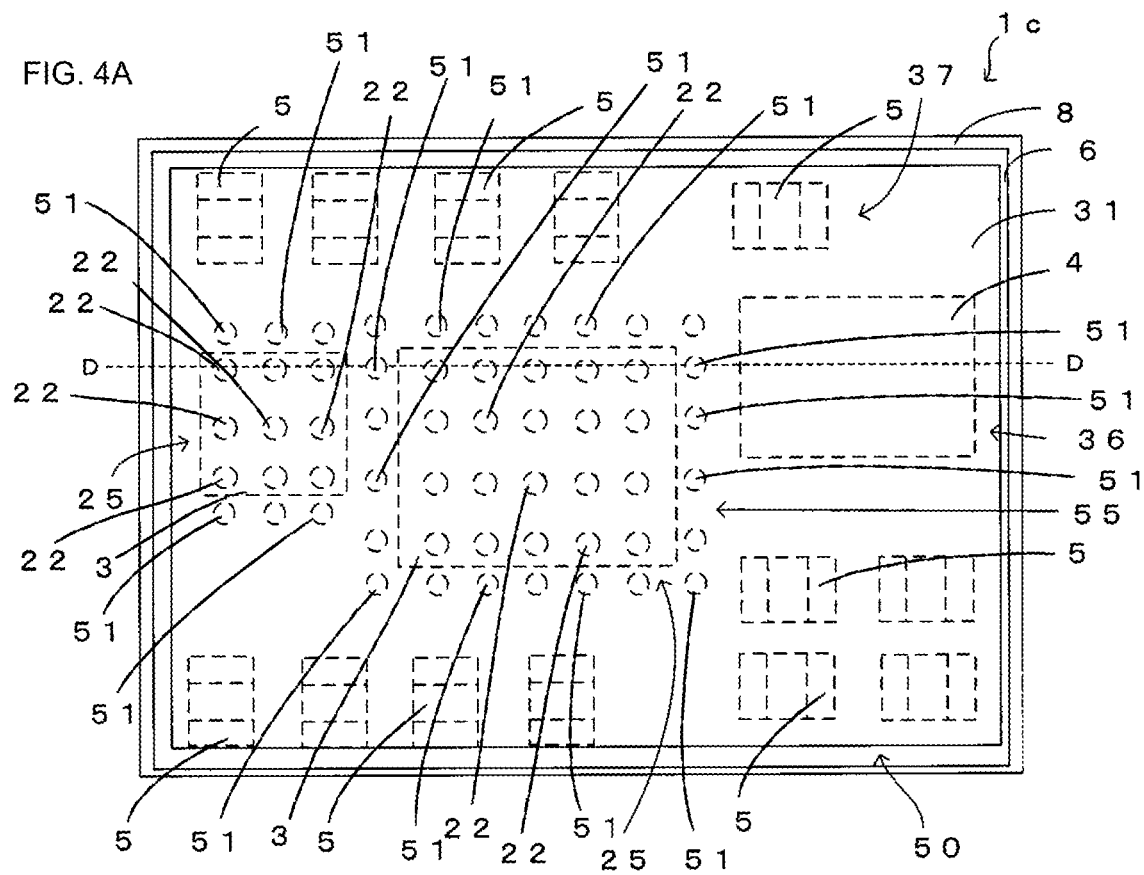
FIG. 4A is a plan view of a module according to a third embodiment of the present disclosure excluding an upper surface portion of a shield layer.
Figure 4B:
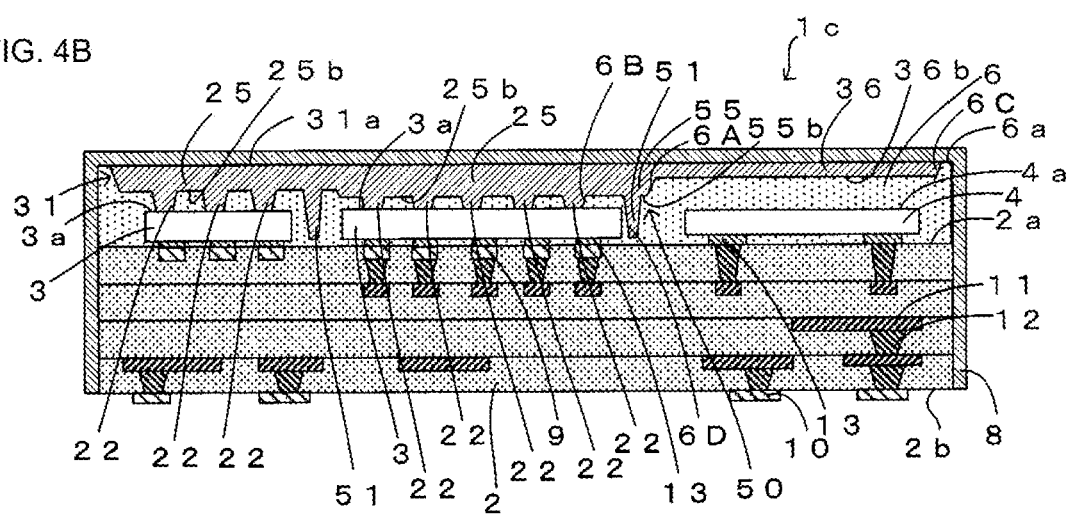
FIG. 4B is a cross-sectional view of the module taken along line D-D in FIG. 4A including the upper surface portion of the shield layer.

A module 1c according to a third embodiment of the present disclosure will now be described with reference to FIGS. 4A and 4B. FIG. 4A is a plan view of the module 1c according to the third embodiment excluding the upper surface portion of the shield layer 8. FIG. 4B is a cross-sectional view of the module taken along line D-D in FIG. 4A including the upper surface portion of the shield layer 8.

The module 1c according to the third embodiment is different from the module 1a according to the second embodiment described with reference to FIGS. 2A and 2B in that, as illustrated in FIGS. 4A and 4B, the heat-dissipating member 30 is replaced with a heat-dissipating member 50 that includes multiple heat-transfer portions 51 having substantially a cylindrical shape and disposed between each of the first components 3 and any of other components (the other first component 3, the second component 4, and the third components 5) when viewed in a plan in a direction perpendicular to the first main surface 2a. Other components are the same as those of the module 1a according to the second embodiment, and are denoted with the same reference signs without necessarily being described.

The heat-dissipating member 50 includes the first heat-dissipating portion 31, the multiple second heat-dissipating portions 22, and multiple heat-transfer portions 51, and is made of a heat conductive material (for example, a highly heat-conductive material such as metal). For example, the first heat-dissipating portion 31, the multiple second heat-dissipating portions 22, and the multiple heat-transfer portions 51 are made of the same heat conductive material. The first heat-dissipating portion 31 according to the third embodiment has the same structure as the first heat-dissipating portion 31 according to the second embodiment. The first heat-dissipating portion 31 includes an inter-component overlap portion 55 that faces the first main surface 2a and overlaps a region between at least the first components 3 and other components (the first components 3, the second component 4, and the third components 5) when viewed in a plan in a direction perpendicular to the first main surface 2a. A portion of the inter-component overlap portion 55 that overlaps at least a region between the second component 4 and the first component 3 mounted at substantially the center of the first main surface 2a corresponds to "an inter-component overlap portion" according to the present disclosure. The second heat-dissipating portions 22 according to the third embodiment have the same structure as that of the second heat-dissipating portions 22 according to the first embodiment.

The multiple heat-transfer portions 51 are substantially circular when viewed in a plan in a direction perpendicular to the first main surface 2a. The multiple heat-transfer portions 51 are disposed on a surface 55b (hereinafter referred to as "an undersurface") of the inter-component overlap portion 55 facing the first main surface 2a when viewed in a plan in a direction perpendicular to the first main surface 2a between each of the first components 3 and any of other components (the first components 3, the second component 4, and the third components 5). To be more specific, the multiple heat-transfer portions 51 are disposed to surround the first component 3 mounted at substantially the center of the first main surface 2a when viewed in a plan in a direction perpendicular to the first main surface 2a. In addition, multiple thermal insulation portions 51 are disposed to surround the first component 3 disposed near one side of the first main surface 2a except on the side facing the side of the first main surface 2a of the first component 3 when viewed in a plan in a direction perpendicular to the first main surface 2a.

Each heat-transfer portion 51 is disposed in a recess 6D formed in the sealing resin layer 6, and has a substantially cylindrical shape that extends from the undersurface 55b of the inter-component overlap portion 55 toward the first main surface 2a between each of the first components 3 and any of other components (the other first component 3, the second component 4, and the third components 5). For example, each heat-transfer portion 51 extends from the undersurface 55b of the inter-component overlap portion 55 toward the first main surface 2a to a predetermined position between the first main surface 2a and the surfaces of the first components 3 including the surface facing the first main surface 2a. Each heat-transfer portion 51 may extend from the undersurface 55b of the inter-component overlap portion 55 toward the first main surface 2a to a position arriving at the first main surface 2a, or may extend to a position not arriving at the first main surface 2a of the substrate 2 not to damage the first main surface 2a.

For each heat-transfer portion 51 disposed between the adjacent first component 3 and the second component 4 or any of the third components 5, the shortest distance between the heat-transfer portion 51 and the first component 3 closest to the heat-transfer portion 51 is smaller than the shortest distance between the heat-transfer portion 51 and one of the second component 4 and the third components 5 closest to the heat-transfer portion 51. For example, for each of the heat-transfer portions 51 disposed between the second component 4 and the first component 3 mounted at substantially the center of the first main surface 2a, the shortest distance between the first component 3 and the heat-transfer portion 51 is smaller than the shortest distance between the second component 4 and the heat-transfer portion 51. For example, for the heat-transfer portion 51 located between the first component 3 disposed adjacent to the side of the first main surface 2a and the third component 5 adjacent to the first component 3, the shortest distance between the first component 3 and the heat-transfer portion 51 is smaller than the shortest distance between the third component 5 and the heat-transfer portion 51.

Although the heat-transfer portion 51 has a substantially cylindrical shape, the heat-transfer portion 51 may have a shape other than the substantially cylindrical shape such as a substantially quadrangular prism shape.

According to the third embodiment, heat generated by one first component 3 is absorbed by the heat-transfer portions 51, and transmitted from the heat-transfer portions 51 to the heat-dissipating members 50 to be dissipated. Thus, the first component 3 is less easily affected by heat generated by the other first component 3, so that the second component 4 and the third components 5 are less easily affected by the heat generated by the first components 3. Thus, the first components 3, the second component 4, and the third components 5 are prevented from having their characteristics fluctuated or their performance deteriorated due to a temperature rise.

Modification Example 1

Figure 5A:
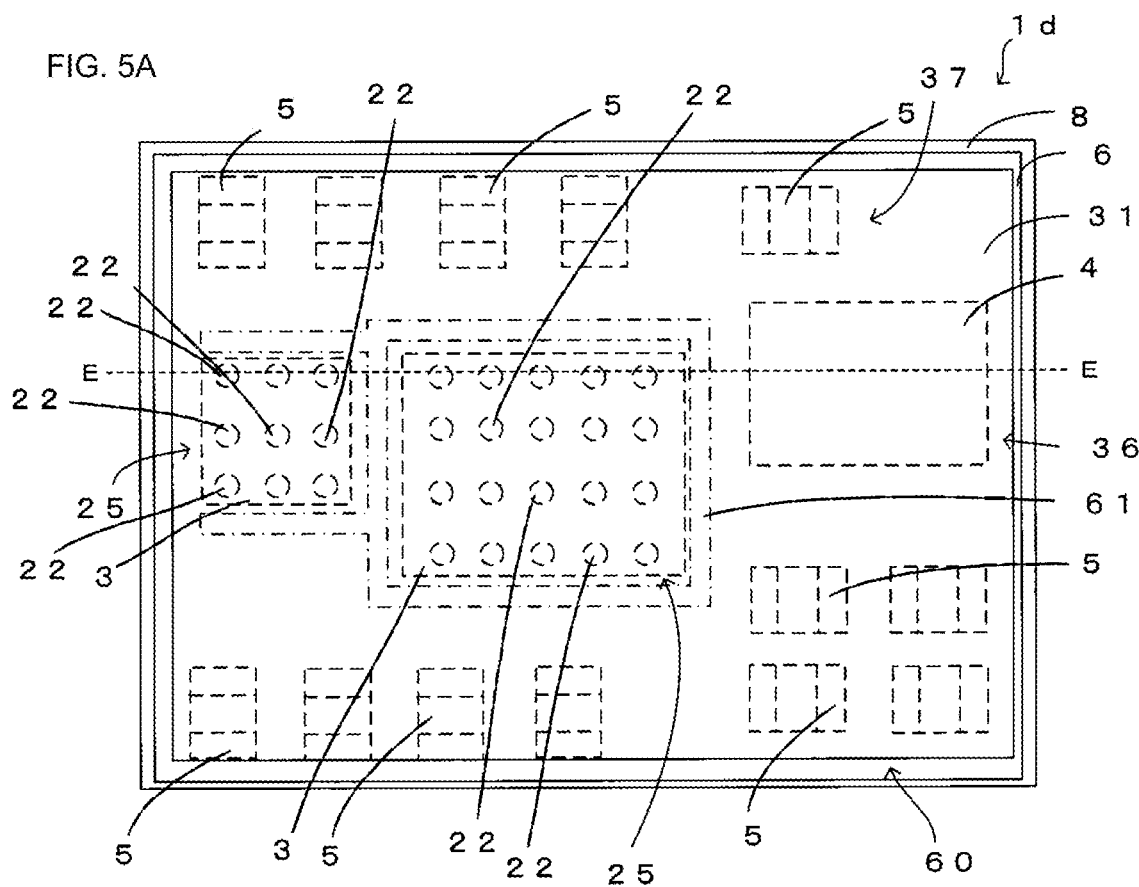
FIG. 5A is a plan view of a module according to modification example 1 according to the third embodiment of the present disclosure excluding an upper surface portion of a shield layer.

A module 1d according to modification example 1 of the third embodiment of the present disclosure will be described with reference to FIGS. 5A and 5B. FIG. 5A is a plan view of the module 1d according to modification example 1 of the third embodiment excluding the upper surface portion of the shield layer 8, and FIG. 5B is a cross-sectional view of the module taken along line E-E in FIG. 5A including the upper surface portion of the shield layer 8.

Figure 5B:
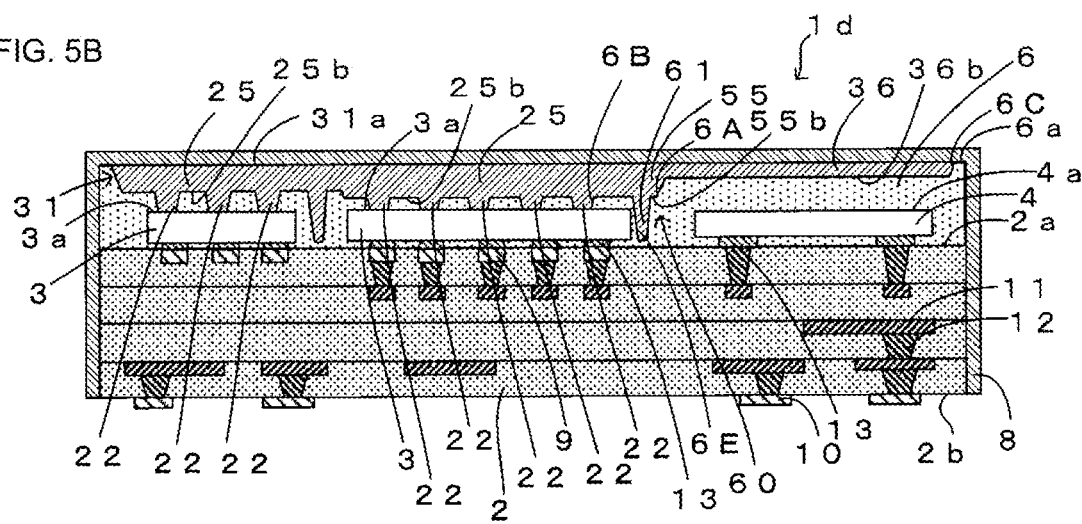
FIG. 5B is a cross-sectional view of the module taken along line E-E in FIG. 5A including the upper surface portion of the shield layer.

As illustrated in FIGS. 5A and 5B, the module 1d according to modification example 1 of the third embodiment is different from the module 1c according to the third embodiment described with reference to FIGS. 4A and 4B in that the heat-dissipating member 50 is replaced with a heat-dissipating member 60 including a heat-transfer portion 61 having a shape different from the shape of the heat-transfer portion 51.

The heat-dissipating member 60 includes a first heat-dissipating portion 31, multiple second heat-dissipating portions 22, and a heat-transfer portion 61, and is made of a heat conductive material (for example, a highly heat-conductive material such as metal). For example, the first heat-dissipating portion 31, the multiple second heat-dissipating portions 22, and the heat-transfer portion 61 are made of the same heat conductive material. The first heat-dissipating portion 31 according to modification example 1 of the third embodiment has the same structure as the first heat-dissipating portion 31 according to the second embodiment. The second heat-dissipating portions 22 according to modification example 1 of the third embodiment have the same structure as the second heat-dissipating portions 22 according to the first embodiment.

The heat-transfer portion 61 is disposed between each of the first components 3 and any of other components (the other first component 3, the second component 4, and the third components 5) on the undersurface 55b of the inter-component overlap portion 55 when viewed in a plan in a direction perpendicular to the first main surface 2a. To be more specific, when viewed in a plan in a direction perpendicular to the first main surface 2a, the heat-transfer portion 61 includes a rectangular frame that surrounds the first component 3 mounted at substantially the center of the first main surface 2a, and an angular-C-shaped frame that surrounds the first component 3 disposed adjacent to the side of the first main surface 2a excluding the sides of the first component 3 facing the side of the first main surface 2a. The frames are integrated together.

The heat-transfer portion 61 is disposed in a recess 6E formed in the sealing resin layer 6, and extends from the undersurface 55b of the inter-component overlap portion 55 toward the first main surface 2a between each of the first components 3 and any of other components (the other first component 3, the second component 4, and the third components 5). For example, the heat-transfer portion 61 extends from the undersurface 55b of the inter-component overlap portion 55 toward the first main surface 2a to a predetermined position between the first main surface 2a and the surfaces of the first components 3 including the surface facing the first main surface 2a. The heat-transfer portion 61 may extend from the undersurface 55b of the inter-component overlap portion 55 toward the first main surface 2a to a position arriving at the first main surface 2a, but may extend to a position not arriving at the first main surface 2a not to damage the first main surface 2a of the substrate 2.

For a flat plate portion of the heat-transfer portion 61 disposed between the adjacent first component 3 and the second component 4 or any of the third components 5, the shortest distance between the flat plate portion of the heat-transfer portion 61 and the first component 3 closest to the flat plate portion is smaller than the shortest distance between the flat plate portion of the heat-transfer portion 61 and one of the second component 4 and the multiple third components 5 closest to the flat plate portion. For example, for the flat plate portion of the heat-transfer portion 61 disposed between the first component 3 and the second component 4 mounted at substantially the center of the first main surface 2a, the shortest distance between the first component 3 and the flat plate portion of the heat-transfer portion 61 is smaller than the shortest distance between the second component 4 and the flat plate portion of the heat-transfer portion 61. For example, for the flat plate portion of the heat-transfer portion 61 disposed between the first component 3 adjacent to the side of the first main surface 2a and the third component 5 adjacent to the first component 3, the shortest distance between the first component 3 and the flat plate portion of the heat-transfer portion 61 is shorter than the shortest distance between the third component 5 and the flat plate portion of the heat-transfer portion 61.

According to modification example 1 of the third embodiment, heat generated by one first component 3 is absorbed by the heat-transfer portions 61, and transmitted from the heat-transfer portions 61 to the heat-dissipating members 60 to be dissipated. Thus, the first component 3 is less easily affected by heat generated by the other first component 3, so that the second component 4 and the third components 5 are less easily affected by heat generated by the first components 3. Thus, the first components 3, the second component 4, and the third components 5 are prevented from having their characteristics fluctuated or their performance deteriorated by a temperature rise.

Modification Example 2

Figure 6A:
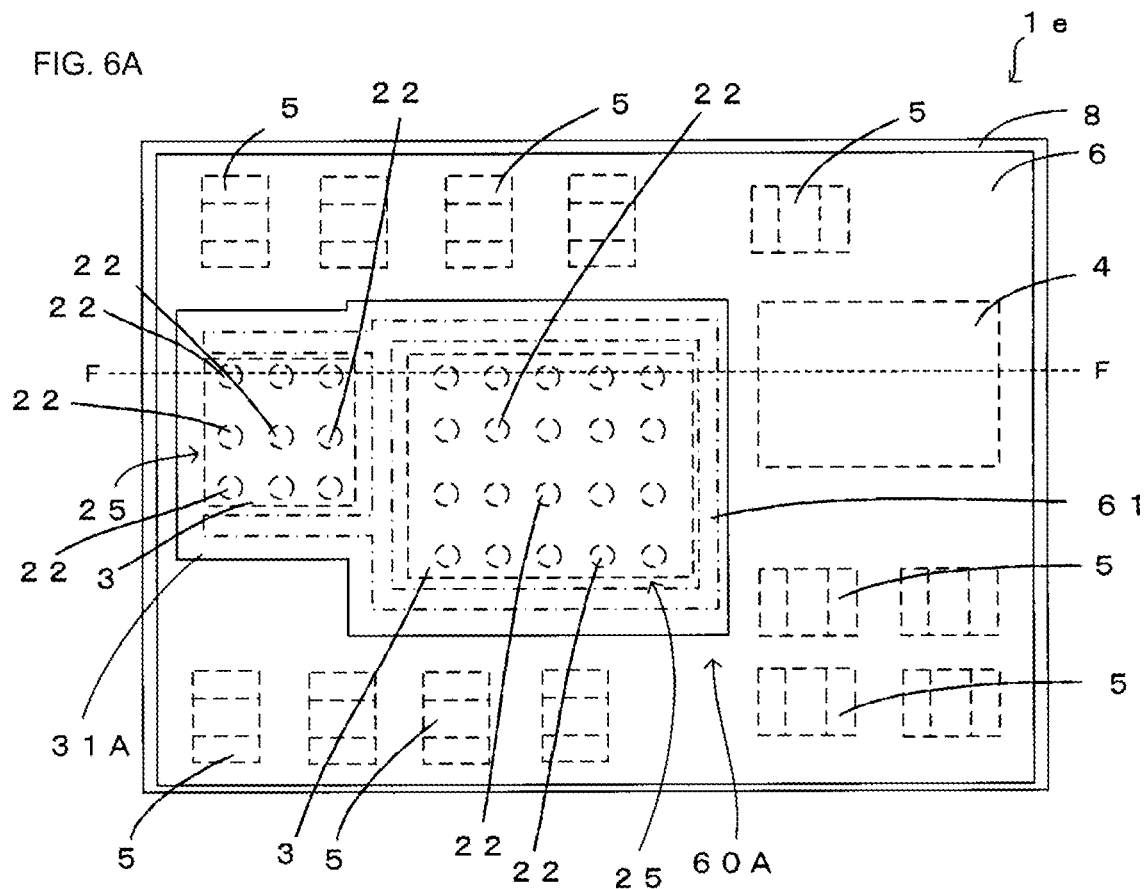
FIG. 6A is a plan view of a module according to modification example 2 according to the third embodiment of the present disclosure excluding an upper surface portion of a shield layer.

A module 1e according to modification example 2 of the third embodiment of the present disclosure will be described with reference to FIGS. 6A and 6B. FIG. 6A is a plan view of the module 1e according to modification example 2 of the third embodiment excluding the upper surface portion of the shield layer 8, and FIG. 6B is a cross-sectional view of the module taken along line F-F in FIG. 6A including the upper surface portion of the shield layer 8.

Figure 6B:
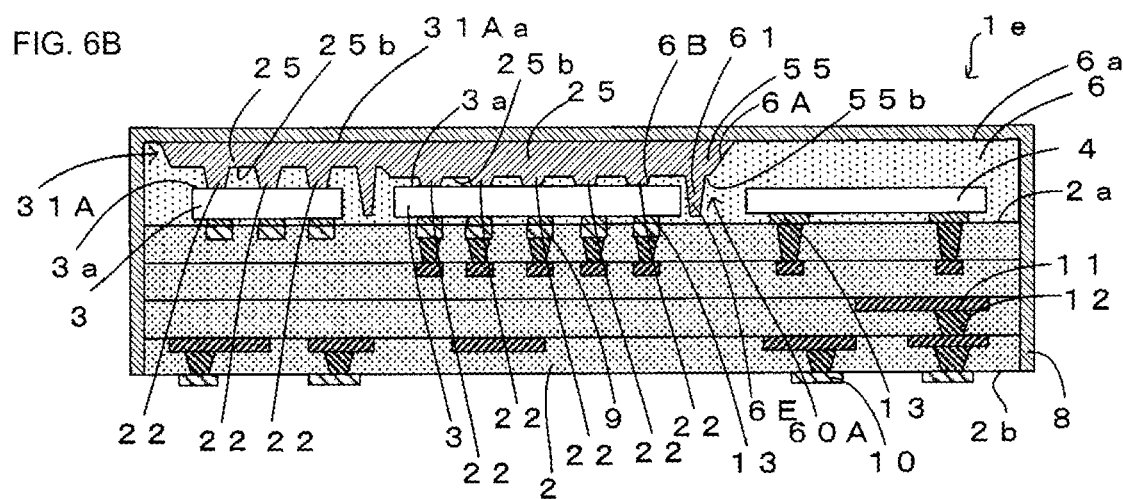
FIG. 6B is a cross-sectional view of the module taken along line F-F in FIG. 6A including the upper surface portion of the shield layer.

As illustrated in FIGS. 6A and 6B, the module 1e according to modification example 2 of the third embodiment is different from the module 1d according to modification example 1 of the third embodiment described with reference to FIGS. 5A and 5B in that the heat-dissipating member 60 is replaced with a heat-dissipating member 60A that includes a first heat-dissipating portion 31A located over a region in which the first components 3 are arranged and not located over a region in which the second component 4 and the third components 5 are arranged when viewed in a plan in a direction perpendicular to the first main surface 2a.

The heat-dissipating member 60A includes a first heat-dissipating portion 31A, multiple second heat-dissipating portions 22, and a heat-transfer portion 61, and is made of a heat conductive material (for example, a highly heat-conductive material such as metal). For example, the first heat-dissipating portion 31A, the multiple second heat-dissipating portions 22, and the heat-transfer portion 61 are made of the same heat conductive material. The second heat-dissipating portions 22 according to modification example 2 of the third embodiment have the same structure as the second heat-dissipating portions 22 according to the first embodiment. The heat-transfer portion 61 according to modification example 2 of the third embodiment has the same structure as the heat-transfer portion 61 according to modification example 1 of the third embodiment.

The first heat-dissipating portion 31A is located over the first components 3, the surrounding region of the upper surface 3a of each first component 3, and a region between the first components 3 when viewed in a plan in a direction perpendicular to the first main surface 2a of the substrate 2. When viewed in a plan in a direction perpendicular to the first main surface 2a of the substrate 2, the first heat-dissipating portion 31A is neither located over a region overlapping the upper surface 4a of the second component 4 nor a region overlapping the upper surfaces of the third components 5. The first heat-dissipating portion 31A includes a first overlap portion 25 corresponding to each of the first components 3. A surface 31Aa of the first heat-dissipating portion 31A disposed parallel to the first main surface 2a and located furthest from the first main surface 2a is on the same plane as the upper surface 6a of the sealing resin layer 6, and exposed from the upper surface 6a of the sealing resin layer 6.

Modification Example 3

Figure 7A:
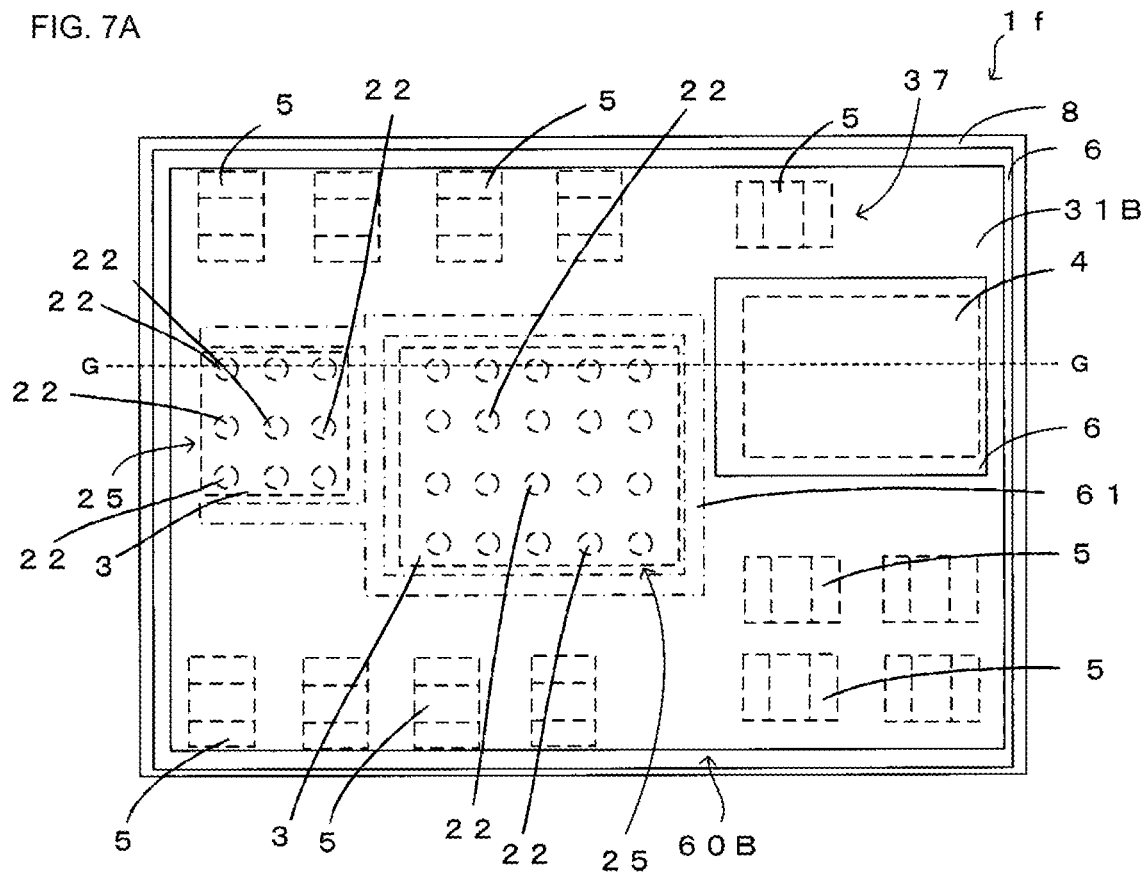
FIG. 7A is a plan view of a module according to modification example 3 according to the third embodiment of the present disclosure excluding an upper surface portion of a shield layer.

A module 1f according to modification example 3 of the third embodiment of the present disclosure will now be described with reference to FIGS. 7A and 7B. FIG. 7A is a plan view of the module 1f according to modification example 3 of the third embodiment excluding the upper surface portion of the shield layer 8, and FIG. 7B is a cross-sectional view of the module taken along line G-G in FIG. 7A including the upper surface portion of the shield layer 8.

Figure 7B:
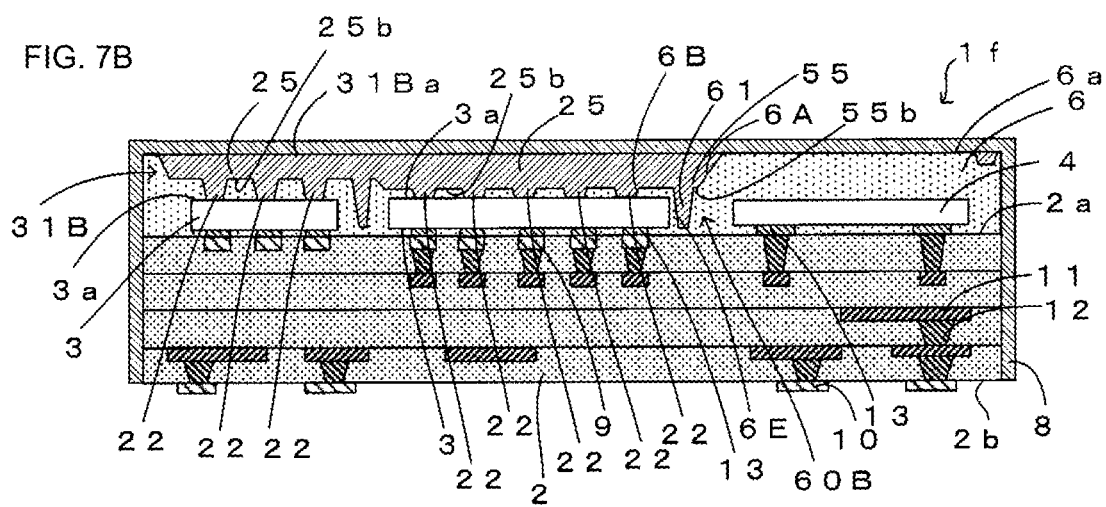
FIG. 7B is a cross-sectional view of the module taken along line G-G in FIG. 7A including the upper surface portion of the shield layer.
Figure 8:
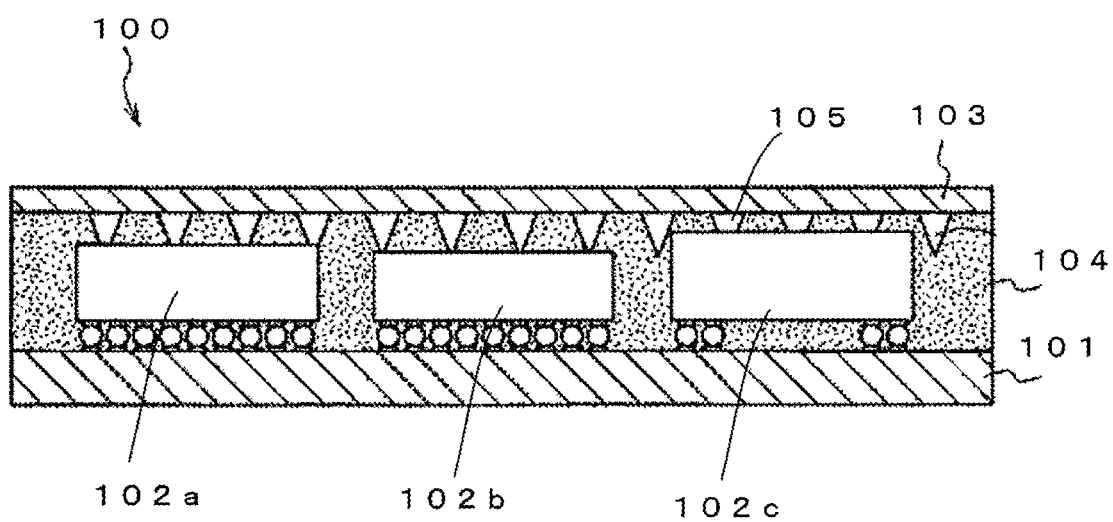
FIG. 8 is a cross-sectional view of an existing module.

As illustrated in FIGS. 7A and 7B, the module 1f according to modification example 3 of the third embodiment is different from the module 1d according to modification example 1 of the third embodiment described with reference to FIGS. 5A and 5B in that the heat-dissipating member 60 is replaced with a heat-dissipating member 60B including a first heat-dissipating portion 31B that excludes the portion of the first heat-dissipating portion 31 overlapping the upper surface 4a of the second component 4 when viewed in a plan in a direction perpendicular to the first main surface 2a.

The heat-dissipating member 60B includes a first heat-dissipating portion 31B, multiple second heat-dissipating portions 22, and a heat-transfer portion 61, and is made of a heat conductive material (for example, a highly heat-conductive material such as metal). For example, the first heat-dissipating portion 31B, the multiple second heat-dissipating portions 22, and the heat-transfer portion 61 are made of the same heat conductive material. The second heat-dissipating portions 22 according to modification example 3 of the third embodiment have the same structure as the second heat-dissipating portions 22 according to the first embodiment. The heat-transfer portion 61 according to modification example 3 of the third embodiment has the same structure as the heat-transfer portion 61 according to modification example 1 of the third embodiment.

When viewed in a plan in a direction perpendicular to the first main surface 2a of the substrate 2, the first heat-dissipating portion 31B is located over the first main surface 2a in a region excluding the peripheral edge portion of the first main surface 2a and excluding the upper surface 4a of the second component 4 and the periphery of the upper surface 4a. The first heat-dissipating portion 31B is located over substantially the entire region overlapping the first main surface 2a when viewed in a plan in a direction perpendicular to the first main surface 2a, excluding the region overlapping the upper surface 4a of the second component 4. The first heat-dissipating portion 31B is considered to be located substantially the entire region when the first heat-dissipating portion 31B overlaps 90% or more of the first main surface 2a except the region overlapping the upper surface 4a of the second component 4 when viewed in a direction perpendicular to the first main surface 2a. The first heat-dissipating portion 31B includes the first overlap portion 25 corresponding to each of the first components 3, and the third overlap portion 37 corresponding to each of the third components 5. A surface 31Ba of the first heat-dissipating portion 31B disposed parallel to the first main surface 2a and located furthest from the first main surface 2a is on the same plane as the upper surface 6a of the sealing resin layer 6 and exposed from the upper surface 6a of the sealing resin layer 6.

The present disclosure is not limited to the above embodiments, and may be changed into various different forms other than the above without necessarily departing from the gist of the disclosure. For example, part of any of the embodiments may be combined with part of any of the modification examples.

INDUSTRIAL APPLICABILITY

The present disclosure is applicable to a module having a heat dissipation structure.

REFERENCE SIGNS LIST 1 to 1f module
2 substrate
2a first main surface
3 first component
4 second component
6 sealing resin layer
7, 30, 40, 50, 60, 60A, 60B heat-dissipating member
21, 31, 31A, 31B, 41 first heat-dissipating portion
22 second heat-dissipating portion
25 first overlap portion
36 second overlap portion
51, 61 heat-transfer portion
55 inter-component overlap portion

The invention claimed is:
1. A module, comprising:
a substrate;
a first component mounted on a first main surface of the substrate and from which heat is to be dissipated;
a sealing resin layer that encloses the first components therein;
a heat-dissipating member that includes a first heat-dissipating portion and a second heat-dissipating portion; and
a second component mounted on the first main surface and from which heat is not to be dissipated,
wherein the sealing resin layer includes a first recess in a surface opposite to a surface facing the first main surface, and a second recess that extends from the first recess toward the first main surface,
wherein the first heat-dissipating portion is disposed in the first recess of the sealing resin layer while being spaced apart from an opposite surface of the first component opposite to a mount surface of the first component, and the first heat-dissipating portion includes a first overlap portion that overlaps at least the opposite surface of the first component when viewed in a plan in a direction perpendicular to the first main surface,
wherein the second heat-dissipating portion is disposed in the second recess of the sealing resin layer, and extends from a surface of the first overlap portion facing the first component toward the opposite surface of the first component,
wherein an area of the second heat-dissipating portion on a surface of the first overlap portion including the surface facing the first component is smaller than an area of the first overlap portion,
wherein the first heat-dissipating portion is spaced apart from an opposite surface of the second component opposite to a mount surface of the second component, and includes a second overlap portion that overlaps at least the opposite surface of the second component when viewed in a plan in a direction perpendicular to the first main surface, and
wherein a shortest distance from a surface of the second overlap portion facing the second component to the opposite surface of the second component is larger than a shortest distance from the surface of the first overlap portion facing the first component to the opposite surface of the first component.

2. A module, comprising:
a substrate;
a first component mounted on a first main surface of the substrate and from which heat is to be dissipated;
a sealing resin layer that encloses the first components therein;
a heat-dissipating member that includes a first heat-dissipating portion and a second heat-dissipating portion; and
a second component mounted on the first main surface and from which heat is not to be dissipated,
wherein the sealing resin layer includes a first recess in a surface opposite to a surface facing the first main surface, and a second recess that extends from the first recess toward the first main surface,
wherein the first heat-dissipating portion is disposed in the first recess of the sealing resin layer while being spaced apart from an opposite surface of the first component opposite to a mount surface of the first component, and the first heat-dissipating portion includes a first overlap portion that overlaps at least the opposite surface of the first component when viewed in a plan in a direction perpendicular to the first main surface,
wherein the second heat-dissipating portion is disposed in the second recess of the sealing resin layer, and extends from a surface of the first overlap portion facing the first component toward the opposite surface of the first component,
wherein an area of the second heat-dissipating portion on a surface of the first overlap portion including the surface facing the first component is smaller than an area of the first overlap portion,
wherein the first heat-dissipating portion includes an inter-component overlap portion that faces the first main surface and that overlaps at least a region between the first component and the second component when viewed in a plan in a direction perpendicular to the first main surface, wherein the heat-dissipating member further includes a heat-transfer portion that extends from a surface of the inter-component overlap portion facing the first main surface toward the first main surface to be located between the first component and the second component, and wherein a shortest distance between the first component and the heat-transfer portion is smaller than a shortest distance between the second component and the heat-transfer portion.

3. The module according to claim 1, wherein the first heat-dissipating portion includes an inter-component overlap portion that faces the first main surface and that overlaps at least a region between the first component and the second component when viewed in a plan in a direction perpendicular to the first main surface, wherein the heat-dissipating member further includes a heat-transfer portion that extends from a surface of the inter-component overlap portion facing the first main surface toward the first main surface to be located between the first component and the second component, and wherein a shortest distance between the first component and the heat-transfer portion is smaller than a shortest distance between the second component and the heat-transfer portion.

4. The module according to claim 2, wherein the heat-transfer portion has a shape of a frame that surrounds the first component and that is located on an outer side portion of at least one side of the first component facing the second component when viewed in a plan in a direction perpendicular to the first main surface.

5. The module according to claim 3, wherein the heat-transfer portion has a shape of a frame that surrounds the first component and that is located on an outer side portion of at least one side of the first component facing the second component when viewed in a plan in a direction perpendicular to the first main surface.

* * * * *

UNITED STATES PATENT AND TRADEMARK OFFICE
CERTIFICATE OF CORRECTION

PATENT NO. : 11,177,189 B2
APPLICATION NO. : 16/581942
DATED : November 16, 2021
INVENTOR(S) : Otsubo et al.

It is certified that error appears in the above-identified patent and that said Letters Patent is hereby corrected as shown below:

In the Specification

Column 18, Line 34:
"module if according to" should be "module 1f according to"

Column 19, Line 37:
"1 to if module" should be "1 to 1f module"

Signed and Sealed this
Nineteenth Day of July, 2022

Katherine Kelly Vidal
*Director of the United States Patent and Trademark Office*